United States Patent
Wang et al.

(10) Patent No.: US 11,632,038 B2
(45) Date of Patent: Apr. 18, 2023

(54) SNUBBER APPARATUS AND POWER CONVERSION APPARATUS

(71) Applicant: FUJI ELECTRIC CO., LTD., Kawasaki (JP)

(72) Inventors: Qichen Wang, Hino (JP); Ryuji Yamada, Hachioji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/456,575

(22) Filed: Nov. 25, 2021

(65) Prior Publication Data

US 2022/0224221 A1 Jul. 14, 2022

(30) Foreign Application Priority Data

Jan. 14, 2021 (JP) .............................. JP2021-004218

(51) Int. Cl.
  *H02M 1/34* (2007.01)
  *H02M 7/00* (2006.01)

(52) U.S. Cl.
  CPC ........... *H02M 1/346* (2021.05); *H02M 7/003* (2013.01)

(58) Field of Classification Search
  CPC ....... H02M 7/003; H02M 3/003; H02M 1/346
  See application file for complete search history.

(56) References Cited

U.S. PATENT DOCUMENTS

| 5,055,990 A | * | 10/1991 | Miki | ................ | H03K 17/08146 363/56.05 |
| 2013/0277849 A1 | | 10/2013 | Fukuda | | |
| 2017/0179095 A1 | | 6/2017 | Ami | | |
| 2017/0338734 A1 | * | 11/2017 | Nakashima | ............. | H02M 1/34 |

FOREIGN PATENT DOCUMENTS

| JP | 2016144340 A | 8/2016 |
| WO | 2012111397 A1 | 8/2012 |
| WO | 2016140008 A1 | 9/2016 |

* cited by examiner

*Primary Examiner* — Jue Zhang (57) ABSTRACT

A snubber apparatus includes N parallel charge paths, each of which has a positive-side capacitor, a first diode, and a negative-side capacitor sequentially connected in series between a positive-side terminal and a negative-side terminal, and that allows current to flow from the positive-side terminal's side to the negative-side terminal's side. The snubber apparatus includes N+1 parallel discharge paths, each of which has a second diode connected between the negative-side terminal or the negative-side capacitor in the k-th charge path of the N charge paths, and the positive-side capacitor in the (k+1)-th charge path of the N charge paths or the positive-side terminal, and that allows current to flow from the negative-side terminal's side to the positive-side terminal's side via at least one of the negative-side capacitor and the positive-side capacitor. At least one of the charge paths has a plurality of sections that are turned and adjacent to each other.

15 Claims, 10 Drawing Sheets

SNUBBER APPARATUS AND POWER CONVERSION APPARATUS

The contents of the following Japanese patent application(s) are incorporated herein by reference:

2021-004218 filed in JP on Jan. 14, 2021

BACKGROUND

1. Technical Field

The present invention relates to a snubber apparatus and a power conversion apparatus.

2. Related Art

Various techniques have been proposed so far for reducing a switching loss while preventing device destruction due to voltage overshoot (see Patent Documents 1 to 3, for example).

Patent Document 1: Japanese Patent Application Publication No. 2016-144340
Patent Document 2: WO No. 2012/111397
Patent Document 3: WO No. 2016/140008

Further reduction in a surge voltage has been desired in recent years.

SUMMARY

In order to solve the above-described problem, a snubber apparatus is provided according to a first aspect of the present invention. The snubber apparatus may include N (N is an integer greater than or equal to 1) parallel charge paths, each of which has a positive-side capacitor, a first diode, and a negative-side capacitor that are sequentially connected in series between a positive-side terminal and a negative-side terminal, and which are configured to allow current to flow from the positive-side terminal's side to the negative-side terminal's side. The snubber apparatus may include N+1 parallel discharge paths, each of which has a second diode that is connected between the negative-side terminal or the negative-side capacitor in the k-th charge path (k is an integer greater than or equal to 0 and less than N) of the N charge paths, and the positive-side capacitor in the (k+1)-th charge path of the N charge paths or the positive-side terminal, and which are configured to allow current to flow from the negative-side terminal's side to the positive-side terminal's side via at least one of the negative-side capacitor and the positive-side capacitor. At least one of the charge paths may have a plurality of sections that are turned and adjacent to each other.

At least two sections of the plurality of sections may be provided on one surface of a board.

The at least two sections may be provided in the same layer on the one surface.

The at least two sections may be provided in different layers on the one surface.

Two or more sections of the plurality of sections may be provided with a board interposed therebetween.

The charge path may be formed to include a conductor pattern. Distance between centerlines of the plurality of sections may be 4 times or less a width of the conductor pattern.

According to a second aspect of the present invention, a power conversion apparatus is provided. The power conversion apparatus may include the snubber apparatus according to the first aspect. The power conversion apparatus may include a switching circuit connected to the positive-side terminal and the negative-side terminal.

A part of a wiring between the positive-side terminal of the switching circuit and the positive-side terminal of the snubber apparatus, and a part of a wiring between the negative-side terminal of the switching circuit and the negative-side terminal of the snubber apparatus may be adjacent to each other.

The summary clause does not necessarily describe all necessary features of the embodiments of the present invention. The present invention may also be a sub-combination of the features described above.

BRIEF DESCRIPTION OF THE DRAWINGS

FIG. 3 shows a current flow for when the switching device 11 is turned on.

DESCRIPTION OF EXEMPLARY EMBODIMENTS

Hereinafter, the present invention will be described through embodiments of the invention, but the following embodiments do not limit the claimed invention. Moreover, not all combinations of features described in the embodiments are necessary to solutions of the invention.

[1. Circuit Structure of Power Conversion Apparatus]

Figure 1:
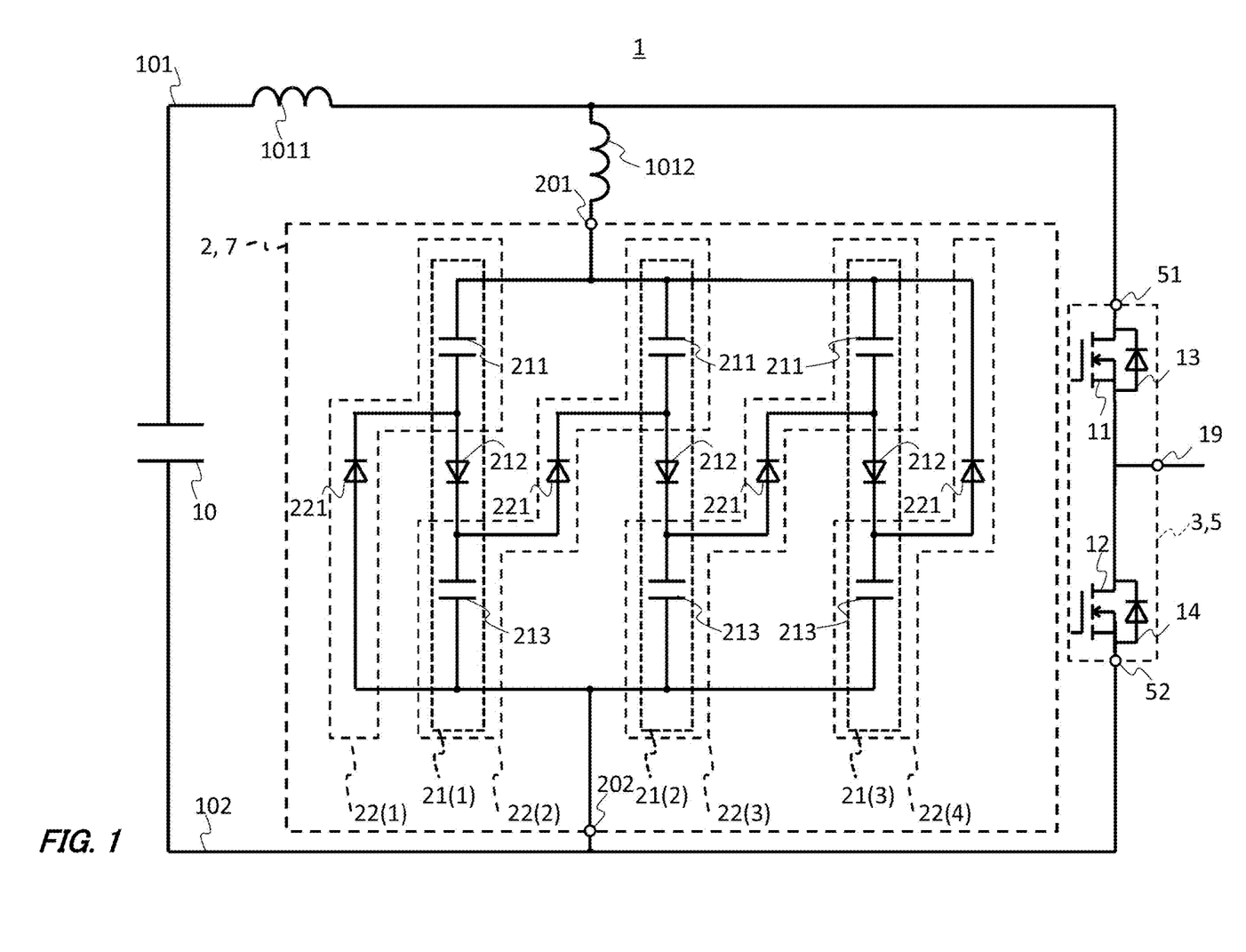
FIG. 1 is a circuit diagram of a power conversion apparatus 1 according to this embodiment.

FIG. 1 is a circuit diagram of a power conversion apparatus 1 according to this embodiment. The power conversion apparatus 1 is one phase of a circuit that converts DC power into multi-phase AC power. The power conversion apparatus 1 outputs the converted voltage from a power source output terminal 19 by switching connection between each electrode of a power source capacitor 10 and the power source output terminal 19. Note that a return path of an AC current to be outputted may be the power source output terminal 19 of another phase. An inductive load (not shown) may be connected to the power source output terminal 19. The power conversion apparatus 1 includes the power source capacitor 10, a switching circuit 3, and a snubber circuit 2. Note that the power conversion apparatus 1 may convert the DC power into single-phase AC power with the switching circuit 3. In this case, the power conversion apparatus 1 may include two power source capacitors 10 that are connected together in series, and the return path of the AC current outputted from the power source output terminal 19 may be a midpoint of the power source capacitor 10.

The power source capacitor 10 serves as a DC power source. A positive-side wiring 101 is connected to one terminal of the power source capacitor 10, and a negative-side wiring 102 is connected to the other terminal. Note that FIG. 1 shows one power source capacitor 10 but the power conversion apparatus 1 may be provided with a plurality of power source capacitors 10 that are connected together in series or in parallel.

The switching circuit 3 is connected between the positive-side wiring 101 and the negative-side wiring 102. As a result, the switching circuit 3 is connected between a positive-side terminal 201 and a negative-side terminal 202 in the snubber circuit 2 described later. The switching circuit 3 according to this embodiment may be a DC/AC inverter, and has switching devices 11 and 12 serving as an upper arm and a lower arm in the power conversion apparatus 1, and freewheeling diodes 13 and 14.

The switching devices 11 and 12 are sequentially connected in series between the negative-side wiring 102 and the positive-side wiring 101. Each of the switching devices 11 and 12 has a drain terminal connected to the positive-side wiring 101's side and a source terminal connected to the negative-side wiring 102's side. A gate drive circuit (not shown) is connected to gate terminals of the switching devices 11 and 12, and controls on/off of the switching devices 11 and 12. For example, the switching devices 11 and 12 may be controlled to be alternatively brought into a connected state before and after a dead time when both of them are turned off. The switching devices 11 and 12 may be controlled by the PWM method. The power source output terminal 19 is connected to a midpoint between the switching device 11 and the switching device 12.

The switching devices 11 and 12 may be silicon semiconductor devices using silicon as a base material, or may be wide bandgap semiconductor devices. A wide bandgap semiconductor device is a semiconductor device having a bandgap larger than that of a silicon semiconductor device, and is a semiconductor device containing, for example, SiC, GaN, diamond, a gallium nitride-based material, a gallium oxide-based material, AlN, AlGaN, ZnO, or the like. Note that the switching devices 11 and 12 may be MOSFETs, or may be semiconductor devices having another structure such as an IGBT or a bipolar transistor.

The freewheeling diodes 13 and 14 are connected in anti-parallel to the switching devices 11 and 12 such that the positive-side wiring 101's side serves as a cathode. The freewheeling diodes 13 and 14 may be schottky barrier diodes. The freewheeling diodes 13 and 14 may be silicon semiconductor devices, or may be wide bandgap semiconductor devices.

At least two of the switching devices 11 and 12 and the freewheeling diodes 13 and 14 may be modularized as a semiconductor module 5. As an example in this embodiment, the switching devices 11 and 12 and the freewheeling diodes 13 and 14 are modularized as the semiconductor module 5. In this case, the drain terminal of the switching device 11 on the positive side may be a positive-side terminal 51 of the semiconductor module 5, and the source terminal of the switching device 12 on the negative side may be a negative-side terminal 52 of the semiconductor module 5.

[1.1. Snubber Circuit 2]

The snubber circuit 2 protects each device of the power conversion apparatus 1 by absorbing a surge voltage generated when current is interrupted by the switching devices 11 and 12. The snubber circuit 2 may be connected between the positive-side wiring 101 and the negative-side wiring 102 via the positive-side terminal 201 and the negative-side terminal 202. As an example in this embodiment, the snubber circuit 2 may be mounted as a snubber apparatus 7 that is attached to the positive-side terminal 51 and the negative-side terminal 52 of the semiconductor module 5. Note that there may be a wiring inductance 1011 according to its wiring length in a wiring (a wiring including the positive-side wiring 101 and the negative-side wiring 102, as an example) between the snubber circuit 2 and the power source capacitor 10. Moreover, there may be a wiring inductance 1012 according to its wiring length in a wiring (the wiring including the positive-side wiring 101 and the negative-side wiring 102, as an example) between the snubber circuit 2 and the switching devices 11 and 12. The wiring inductance 1012 may further include an internal inductance of the snubber circuit 2.

The snubber circuit 2 has N parallel charge paths 21 and N+1 parallel discharge paths 22. Note that the number N is an integer greater than or equal to 1, and is 3 as an example in this embodiment. Moreover, as an example in this embodiment, three charge paths 21 will be described as a first charge path 21 (1), a second charge path 21 (2), and a third charge path 21 (3) starting from the left side of the figure. Moreover, four discharge paths 22 will be described as a first discharge path 22 (1), a second discharge path 22 (2), a third discharge path 22 (3), and a fourth discharge path 22 (4) starting from the left side of the figure.

Each charge path 21 has a positive-side capacitor 211, a first diode 212, and a negative-side capacitor 213 that are sequentially connected in series between the positive-side terminal 201 and the negative-side terminal 202. Each of the positive-side capacitor 211 and the negative-side capacitor 213 serves as a snubber capacitor, and may absorb a surge voltage (a surge voltage applied to the device in a period longer than 10 ns and shorter than 10 μs, as an example) instantaneously generated when the switching devices 11 and 12 are driven. For example, the positive-side capacitor 211 and the negative-side capacitor 213 may suppress vibration larger than 100 kHz and smaller than 100 MHz. The positive-side capacitor 211 and the negative-side capacitor 213 may be film capacitors or laminated ceramic capacitors, as an example.

The first diode 212 is arranged with its anode facing toward the positive-side terminal 201 and with its cathode facing toward the negative-side terminal 202. As a result, each charge path 21 allows the current to flow from the positive-side terminal 201's side to the negative-side terminal 202's side.

Each discharge path 22 has a second diode 221. The second diode 221 is connected between the negative-side terminal 202 or the negative-side capacitor 213 in the k-th charge path 21 (k is an integer greater than or equal to 0 and less than or equal to N) of the N charge paths 21, and the positive-side capacitor 211 in the (k+1)-th charge path 21 of the N charge paths 21 or the positive-side terminal 201. For example, the second diode 221 of the first discharge path 22 (1) is connected between the negative-side terminal 202 and the positive-side capacitor 211 of the first charge path 21 (1). The second diode 221 of the second discharge path 22 (2) is connected between the negative-side capacitor 213 of the first charge path 21 (1) and the positive-side capacitor 211 of the second charge path 21 (2). The second diode 221 of the third discharge path 22 (3) is connected between the negative-side capacitor 213 of the second charge path 21 (2) and the positive-side capacitor 211 of the third charge path 21 (3). The second diode 221 of the fourth discharge path 22 (4) is connected between the negative-side capacitor 213 of the third charge path 21 (3) and the positive-side terminal 201. The second diode 221 is arranged with its anode facing toward the k-th charge path 21 (k) or the negative-side terminal 202 and with its cathode facing toward the (k+1)-th charge path 21 (k+1) or the positive-side terminal 201. As a result, each discharge path 22 allows the current to flow from the negative-side terminal 202's side to the positive-side terminal 201's side via at least one of the negative-side capacitor 213 and the positive-side capacitor 211.

Note that a wiring inductance of each charge path 21 may be smaller than a wiring inductance of each discharge path 22. For example, a wiring length of each charge path 21 may be shorter than a wiring length of each discharge path 22. To be more specific, the wiring length of each charge path 21 connecting the positive-side terminal 201 and the negative-side terminal 202 may be shorter than the wiring length of each discharge path 22 connecting the positive-side terminal 201 and the negative-side terminal 202.

[1.2. Operation of Snubber Circuit 2]

First, operation will be described for when the switching device 11 is turned off after a state where the switching device 11 is on and the switching device 12 is off. In the state where the switching device 11 is on and the switching device 12 is off, an output current flows through a path of the power source capacitor 10, the positive-side wiring 101, the switching device 11, and the power source output terminal 19. At this moment, the output current flows through the wiring inductance 1012, in which energy is stored.

Figure 2:
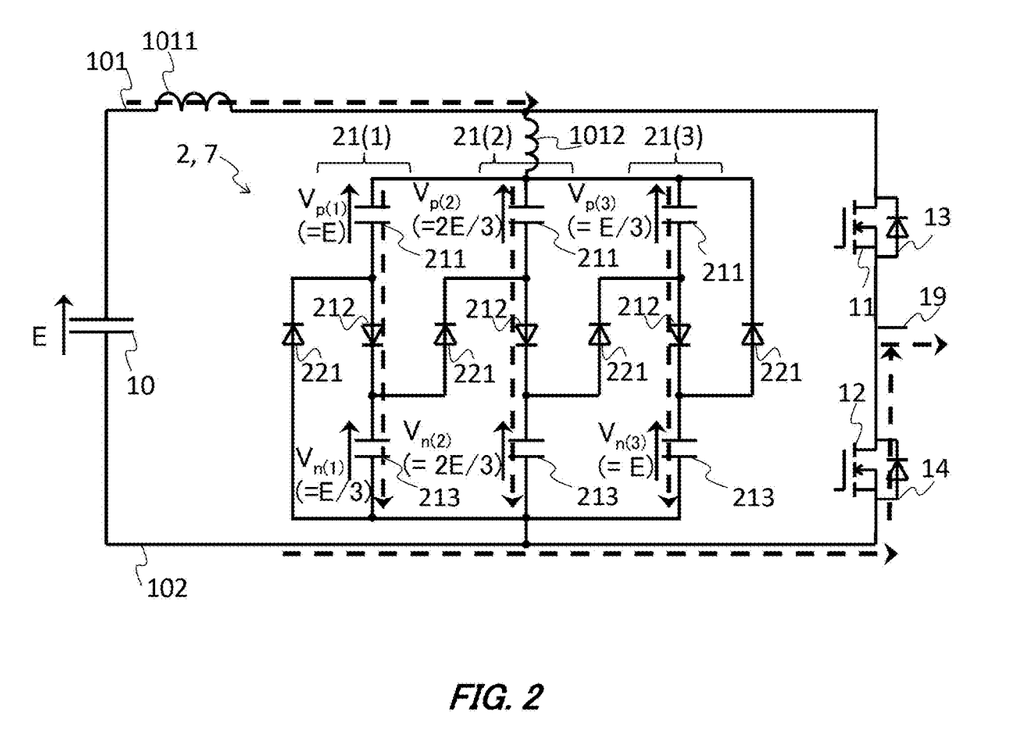
FIG. 2 shows a current flow for when a switching device 11 is turned off.

FIG. 2 shows a current flow for when the switching device 11 is turned off after this state. Note that, in the figure, a dashed arrow indicates a current flow, and a solid arrow indicates voltages of the power source capacitor 10, the positive-side capacitor 211, negative-side capacitor 213, or the like, or voltage generated by the wiring inductance 1012 or the like.

When the switching device 11 is turned off, the output current is commutated, flows from the power source capacitor 10 and the positive-side wiring 101 to the positive-side capacitor 211, first diode 212, and the negative-side capacitor 213 of each charge path 21, and is outputted from the power source output terminal 19 via a freewheeling diode 14. As a result, current energy of the wiring inductance 1012 is absorbed through charging of the positive-side capacitor 211 and the negative-side capacitor 213 of the charge path 21. Finally, the output current is all commutated to a path of the power source capacitor 10, the negative-side wiring 102, the freewheeling diode 14, and the power source output terminal 19. As a result, the commutation associated with turn-off operation of the switching device 11 is completed.

Figure 3:
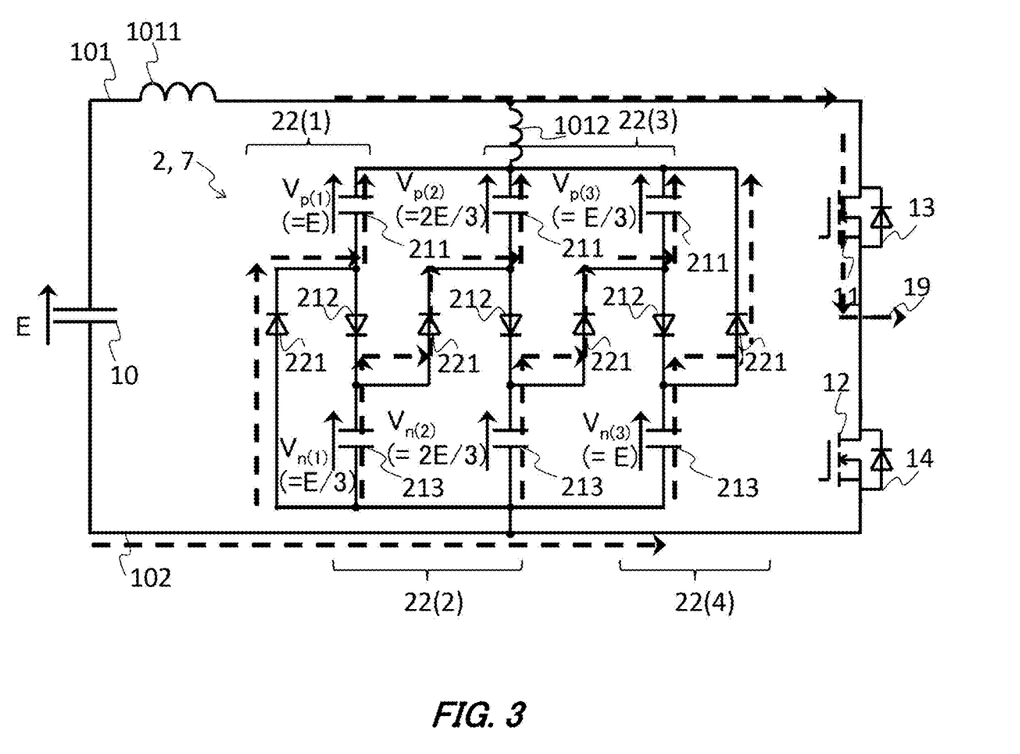

FIG. 3 shows a current flow for when the switching device 11 is turned on again after a state where the turn-off operation of the switching device 11 is completed.

When the switching device 11 is turned on again, the output current that was flowing through the path of the power source capacitor 10, the negative-side wiring 102, the freewheeling diode 14, and the power source output terminal 19 is commutated to a path of the power source capacitor 10, the negative-side wiring 102, the second diode 221 of each discharge path 22, the switching device 11, and the power source output terminal 19. At this moment, the energy at the time of turn-off operation that has been stored in the positive-side capacitor 211 and/or the negative-side capacitor 213 on the anode side/the cathode side of the second diode 221 is released. Finally, the output current is all commutated to the path of the power source capacitor 10, the positive-side wiring 101, the switching device 11, and the power source output terminal 19. As a result, the commutation associated with turn-on operation of the switching device 11 is completed.

Now, voltages of the positive-side capacitor 211 and the negative-side capacitor 213 at the time of turn-off and turn-on operations of the switching device 11 will be described. A relationship between the voltages of the positive-side capacitor 211 and the negative-side capacitor 213 of each charge path 21 at the time of turn-off operation is represented by the following formula (1). Note, however, that, in this figure, E is the voltage of the power source capacitor 10, and $V_{dc\text{-}off}$ is an inter-terminal voltage between the positive-side wiring 101 and the negative-side terminal 202 at the time of turn-off operation. Moreover, $V_{p\,(1)}$ to $V_{p\,(3)}$ are the voltages of the positive-side capacitors 211 in the first charge path 21 (1) to the third charge path 21 (3). Moreover, $V_{N\,(1)}$ to $V_{N\,(3)}$ are the voltages of the negative-side capacitors 213 in the first charge path 21 (1) to the third charge path 21 (3).

$$E \leq (V_p(1) + V_N(1)) \qquad (1)$$
$$= (V_p(2) + V_N(2))$$
$$= (V_p(3) + V_N(3))$$
$$V_{dc\text{-}off}$$

Moreover, a relationship between the voltages of the positive-side capacitor 211 and the negative-side capacitor 213 of each charge path 21 at the time of turn-on operation is represented by the following formula (2). Note, however, that, in this figure, $V_{dc\text{-}oN}$ is an inter-terminal voltage between the positive-side wiring 101 and the negative-side terminal 202 at the time of turn-on operation.

$$E \geq V_p(1) \qquad (2)$$
$$= (V_N(1) + V_p(2))$$
$$= (V_N(2) + V_p(3))$$
$$= V_N(3)$$
$$= V_{dc\text{-}oN}$$

According to the formula (1) and the formula (2), a relationship between the voltages of each positive-side capacitor 211 and each negative-side capacitor 213 is represented by the following formula (3) (see also the voltages shown in FIG. 2 and FIG. 3). Note, however, that, in this figure, Vdc is an inter-terminal voltage between the positive-side terminal 51 and the negative-side terminal 52 at a steady state.

$$E = V_{dc} \approx V_p(1) \qquad (3)$$
$$= V_N(3)$$
$$= 1.5 \times V_p(2)$$
$$= 1.5 \times V_N(2)$$
$$= 3 \times V_N(1)$$
$$= 3 \times V_p(3)$$

It is learned from the formula (3) that a charge voltage (4E/3, as an example in FIG. 3) in each charge path 21 for when a capacitor current is interrupted is higher than a discharge voltage (E, as an example in FIG. 3) in each of the discharge paths 22. Note that, since a similar effect is achieved, because of a symmetric property of the circuit, at the turn-on and turn-off operations of the switching device 12 for when the output current flows in the opposite direction, detailed description will be omitted.

According to the snubber circuit 2 described above, N parallel charge paths 21 are provided, each of which has the positive-side capacitor 211 and the negative-side capacitor 213. Therefore, when the current is interrupted by the semiconductor module 5, the energy stored in the wiring inductance 1012 passes through each charge path 21, and charges the positive-side capacitor 211 and the negative-side capacitor 213 to voltage higher than the voltage between the positive-side wiring 101 and the negative-side terminal 202. This prevents device destruction due to voltage overshoot.

Moreover, the snubber circuit 2 is provided with N+1 discharge paths 22 that allow the current to flow from the negative-side terminal 202's side to the positive-side terminal 201's side via at least one of the negative-side capacitor 213 and the positive-side capacitor 211. Therefore, when the current is made to flow by the semiconductor module 5, the energy stored in the positive-side capacitor 211 and the negative-side capacitor 213 is discharged, and the discharge voltage of each discharge path 22 drops to voltage between the positive-side terminal 201 and the negative-side terminal 202.

Since the charge voltage in each of the N charge paths 21 for when the current is interrupted is higher than the discharge voltage in each of the discharge paths 22, the energy charging the charge path 21 when the current is interrupted cannot further charge the charge path 21 even if being discharged by the discharge path 22. Therefore, the energy charging the positive-side capacitor 211 and the negative-side capacitor 213 when the current is interrupted is stored in the positive-side capacitor 211 and the negative-side capacitor 213 to be regenerated, without being consumed as a circuit loss as a result of being charged and discharged due to resonance operation between the wiring inductance 1011, and the positive-side capacitor 211 and the negative-side capacitor 213. This reduces the circuit loss due to the resonance operation.

Since it is possible to prevent the device destruction due to the voltage overshoot for when the current is interrupted and reduce the circuit loss in this way, an allowance amount of inductance of a wiring connected to the positive-side terminal 51 and the negative-side terminal 52 of the semiconductor module 5 can be increased. That is, a degree of freedom of the wiring lengths of the positive-side wiring 101 and the negative-side wiring 102 can be improved.

Note that, as mentioned above, in the snubber circuit 2, the charge voltage in each charge path 21 for when the current is interrupted is 4E/3(V). Therefore, a voltage ΔV1 generated due to the wiring inductance 1012, of a surge voltage instantaneously generated between the positive-side wiring 101 and the negative-side wiring 102 is generated based on 4E/3(V) in a form added to 4E/3(V).

In contrast, when a single snubber capacitor is connected between the positive-side wiring 101 and the negative-side wiring 102, since a charge voltage of the snubber capacitor is E(V), the voltage ΔV1 generated due to the wiring inductance 1012, of the surge voltage is generated in a form added to E(V).

Therefore, in the snubber circuit 2, a total surge voltage instantaneously generated between the positive-side wiring 101 and the negative-side wiring 102 due to the wiring inductance 1012, that is, a sum voltage of the voltage ΔV1 and the voltage as a base, is higher than when the single snubber capacitor is connected between the positive-side wiring 101 and the negative-side wiring 102.

[1.3. Operation Waveform]

Figure 4:
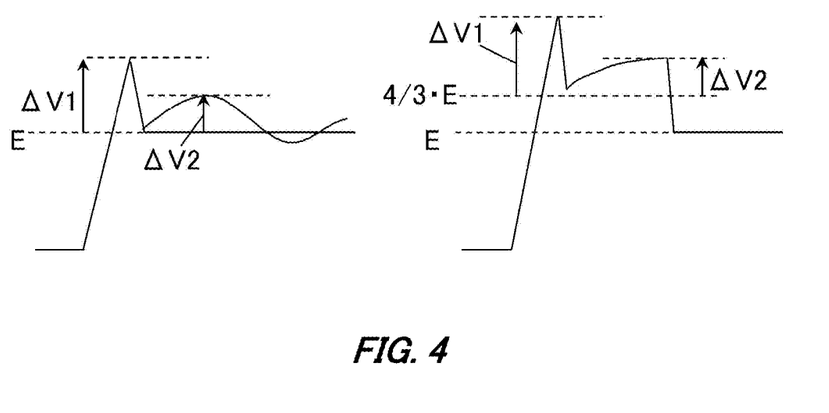
FIG. 4 shows voltage applied to the switching device 11 when the switching device 11 is turned off to become non-conductive.

FIG. 4 shows voltage applied to the switching device 11 when the switching device 11 is turned off to become non-conductive. In the figure, the vertical axis represents voltage, and the horizontal axis represents time. Moreover, a graph on the left side in the figure is an operation waveform for when the single snubber capacitor is connected between the positive-side wiring 101 and the negative-side wiring 102. A graph on the right side in the figure is an operation waveform for when the snubber circuit 2 is connected between the positive-side wiring 101 and the negative-side wiring 102.

As shown in the graph on the left side in the figure, when the single snubber capacitor is connected, the voltage ΔV1 due to the wiring inductance 1012 is generated in the form added to the voltage E(V) of the power source capacitor 10, and energy of a voltage ΔV2 due to the wiring inductance 1011 is lost due to resonance between the wiring inductance 1011 and the snubber capacitor.

Moreover, as shown in the graph on the right side in the figure, when the snubber circuit 2 is connected, since the resonance between the wiring inductance 1011 and the snubber capacitor is not generated, the energy of the voltage ΔV2 is regenerated without being lost. Note, however, that the voltage ΔV1 (a peak value of the surge voltage generated due to the wiring inductance 1012 as a result of commutation to the snubber circuit 2 during the turn-off operation of the switching device 11 or 12) is generated in the form added to the voltage 4E/3(V) of the charge path 21. Note, however, that, in the snubber apparatus 7 according to this embodiment, the charge path 21 is formed so that such a surge voltage ΔV1 is reduced.

[1.4. Layout of Charge Path 21]

Figure 5:
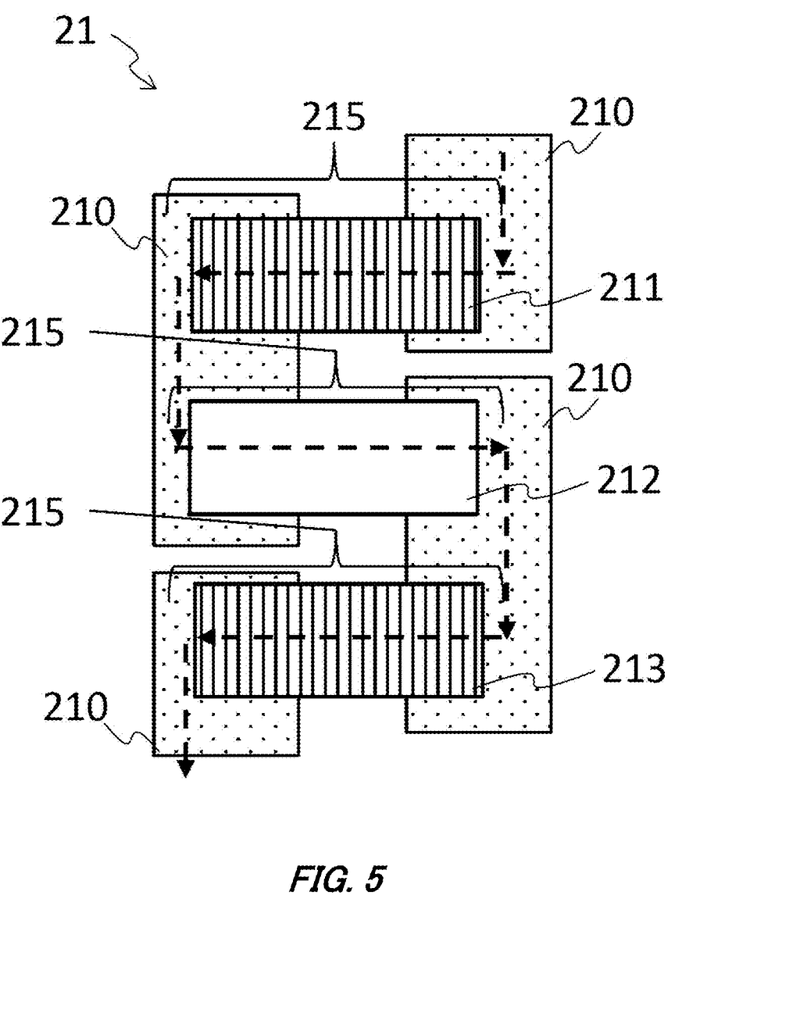
FIG. 5 shows a charge path 21.

FIG. 5 shows the charge path 21. Note that a dotted arrow in the figure indicates current flowing through the charge path 21 when the switching device 11 is turned off. Moreover, in this figure, the positive-side capacitor 211, the negative-side capacitor 213, and the first diode 212 are shown as devices that are surface-mounted on a printed wiring board. Moreover, in this figure, the charge path 21 is formed to include a conductor pattern 210, for example, with a wiring part except the devices as the conductor pattern 210, but may also include a conducting wire made of a metal such as copper. Moreover, in this figure, the positive-side wiring 101 and the negative-side wiring 102 are not shown, but the positive-side wiring 101 and the negative-side wiring 102 may be provided to extend along the vertical direction of the figure and to be apart from each other in the horizontal direction, or may be provided to extend along the horizontal direction of the figure and to be apart from each other in the vertical direction.

At least one charge path 21 of the plurality of charge paths 21 provided in the snubber circuit 2 may have a plurality of sections (also referred to as adjacent sections 215) that are turned and adjacent to each other. "Being adjacent" may mean being adjacent to each other in a direction different from a direction in which current flows (a direction orthogonal to the direction in which the current flows, as an example). The adjacent sections 215 may run in opposite directions and may allow the current to flow in opposite directions. As a result, the adjacent sections 215 may differentially act on each other to mutually negate magnetic fields.

The plurality of adjacent sections 215 may have two or more sections among a section included between the positive-side terminal 201 and the first diode 212, a section included between the positive-side capacitor 211 and the negative-side capacitor 213, a section included between the first diode 212 and the negative-side terminal 202, a section included between the positive-side terminal 201 and the positive-side capacitor 211, a section included between the positive-side capacitor 211 and the first diode 212, a section included between the first diode 212 and the negative-side capacitor 213, a section included between the negative-side capacitor 213 and the negative-side terminal 202. Each of the adjacent sections 215 may have a linear shape, or may have a curved shape.

As an example in this figure, the charge path 21 has three adjacent sections 215. These adjacent sections 215 are the section included between the positive-side terminal 201 and the first diode 212, the section included between the positive-side capacitor 211 and the negative-side capacitor 213, and the section included between the first diode 212 and the negative-side terminal 202.

At least two of the plurality of adjacent sections 215 included in one charge path 21 may be provided on one surface of the board on which the snubber circuit 2 is formed. In this case, the at least two adjacent sections 215 may be provided in the same layer (an outermost layer, as an example) on the one surface, or may be provided in different layers on the one surface. When the adjacent sections 215 are provided in the different layers on the one surface of the board, each the layers may be laminated with an insulation layer interposed therebetween and be electrically connected through a conductive via.

According to the snubber apparatus 7 having the charge path 21 as described above, since the charge path 21 includes the plurality of adjacent sections 215 that are turned and adjacent to each other, these adjacent sections 215 differentially act on each other to mutually negate magnetic fields, and the inductance of the charge path 21, and eventually the internal inductance and the wiring inductance 1012 of the snubber circuit 2 are decreased. Therefore, it is possible to reduce a surge voltage for when the switching circuit 3 is turned off.

Moreover, since the at least two adjacent sections 215 are provided on the one surface of the board, the adjacent sections 215 can be easily formed.

Moreover, when the at least two adjacent sections 215 are provided in the same layer on the one surface, since the adjacent sections 215 can be formed in the same layer to form the charge path 21, the charge path 21 can be easily formed.

Moreover, when the at least two adjacent sections 215 are provided in the different layers on the one surface, it can be ensured that the adjacent sections 215 differentially act on each other to mutually negate magnetic fields and the inductance of the charge path 21 is decreased.

[1.5. Overall Layout of Snubber Circuit 2]

Figure 6:
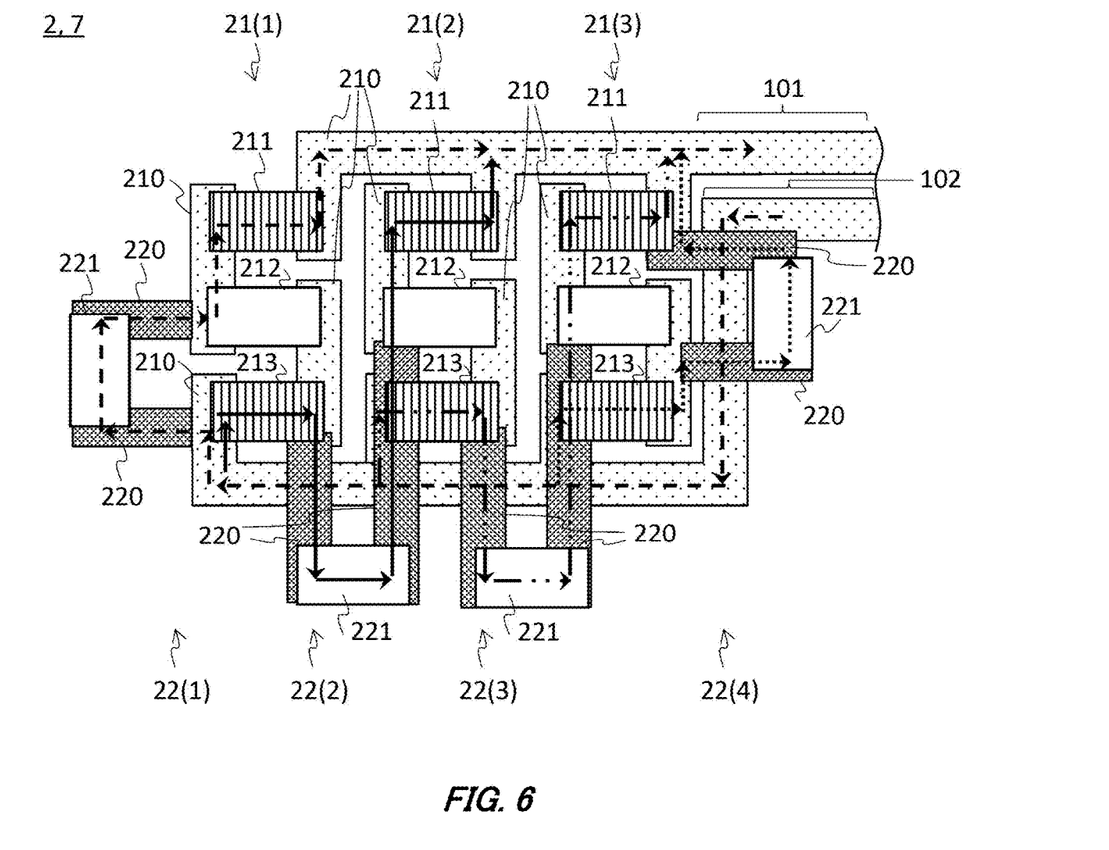
FIG. 6 shows an overall layout of a snubber circuit 2.

FIG. 6 shows an overall layout of the snubber circuit 2.

Each charge path 21 of the snubber circuit 2 may have the plurality of adjacent sections 215 that are turned and adjacent to each other. For example, illustration of reference numerals is omitted in this figure, but each of the three charge paths 21 (1) to 21 (3) may have three adjacent sections 215 as in FIG. 5.

Each discharge path 22 of the snubber circuit 2 may be arbitrarily disposed to bypass the charge path 21. As an example in this embodiment, the discharge path 22 may be formed to include a conductor pattern 220 of a layer different from that of the conductor pattern 210 of the charge path 21. A coil may be provided in a middle part of the discharge path 22 in order to increase the inductance. Note that a conductive via (not shown) may be provided in an electrically connected part between the conductor pattern 210 and the conductor pattern 220. Moreover, an arrow in each line style in the figure indicates current flowing when the switching device 11 is turned on.

Figure 7:
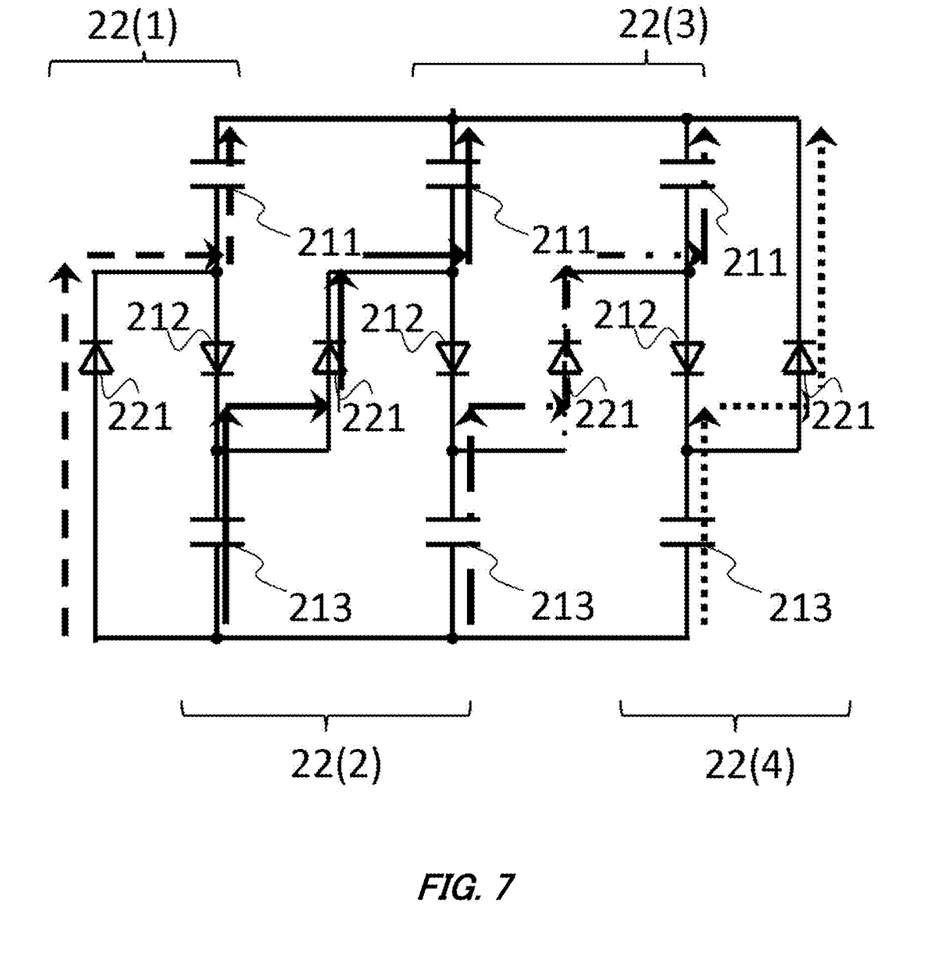
FIG. 7 shows a current flow in FIG. 6 on a circuit diagram.

FIG. 7 shows a current flow in FIG. 6 on a circuit diagram. As shown in this figure, a dotted arrow indicates current flowing through the first discharge path 22 (1), a solid arrow indicates current flowing through the second discharge path 22 (2), a two-dot chain line arrow indicates current flowing through the third discharge path 22 (3), and a dashed arrow indicates current flowing through the fourth discharge path 22 (4).

Note that, as shown in FIG. 6, a part of the positive-side wiring 101 between the positive-side terminal 51 of the switching circuit 3 and the positive-side terminal 201 of the snubber apparatus 7, and a part of the negative-side wiring 102 between the negative-side terminal 52 of the switching circuit 3 and the negative-side terminal 202 of the snubber apparatus 7 may be adjacent to each other. For example, the part of the positive-side wiring 101 and the part of the negative-side wiring 102 may be provided in the same layer of the one surface of the board to be adjacent to each other, or may be provided in the different layers to be adjacent to each other. As an example, the part of the positive-side wiring 101 and the part of the negative-side wiring 102 may be formed in a planar shape in the different layers of the board to be adjacent to each other. The part of the positive-side wiring 101 and the part of the negative-side wiring 102 that are adjacent to each other may differentially act on each other to mutually negate magnetic fields. As a result, the wiring inductance 1012 between the snubber circuit 2 and the switching devices 11 and 12 is further decreased, so that the surge voltage for when the switching circuit 3 is turned off can be further reduced.

[1.6. Distance between Adjacent Sections 215]

Figure 8:
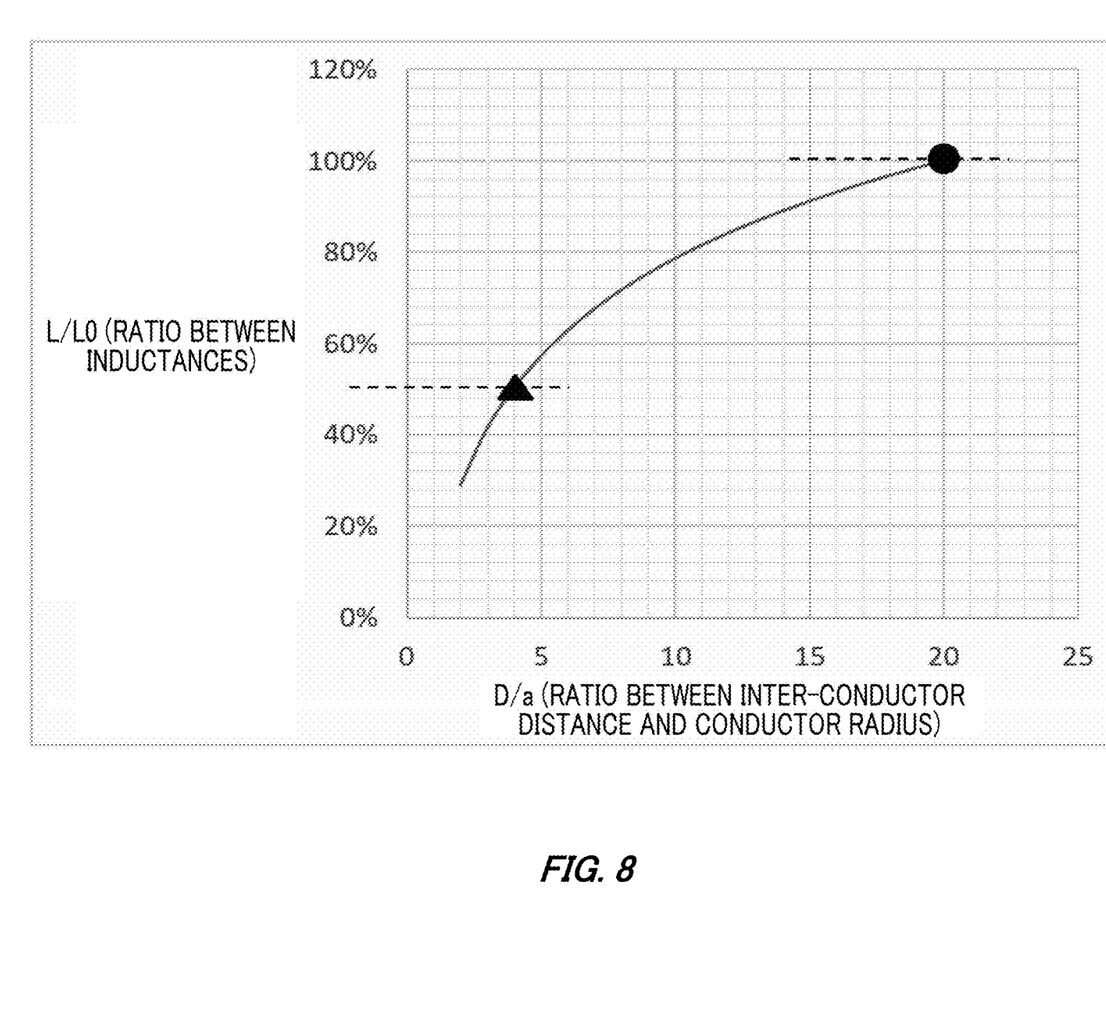
FIG. 8 shows a relationship between a conductor inductance and an inter-conductor distance.

FIG. 8 shows a relationship between a conductor inductance and an inter-conductor distance. In the figure, the horizontal axis represents a ratio between the inter-conductor distance (D) for when the conductors are turned to be adjacent to each other, and a conductor radius (a). The inter-conductor distance may be a distance between centers of the conductors. Moreover, the vertical axis represents a ratio between the conductor inductance (L) and a reference inductance ($L_0$). The reference inductance ($L_0$) may be inductance for when the inter-conductor distance is long enough, and is, as an example in this figure, inductance for when D/a=20 (see a circle plot in the figure). The conductor radius may have a length of half a width of the conductor pattern.

As shown in this figure, when the inter-conductor distance is decreased, the conductor inductance is decreased, and when D/a becomes 4 (that is, the inter-conductor distance (D) becomes 4 times the conductor radius (a)), a reduction rate of the inductance becomes approximately 50% (see triangle plot in the figure). Therefore, as an example in this embodiment, the distance (D) between centerlines of the adjacent sections 215 may be 4 times or less the width (a) of the conductor pattern.

[2. Variation]

Figure 9:
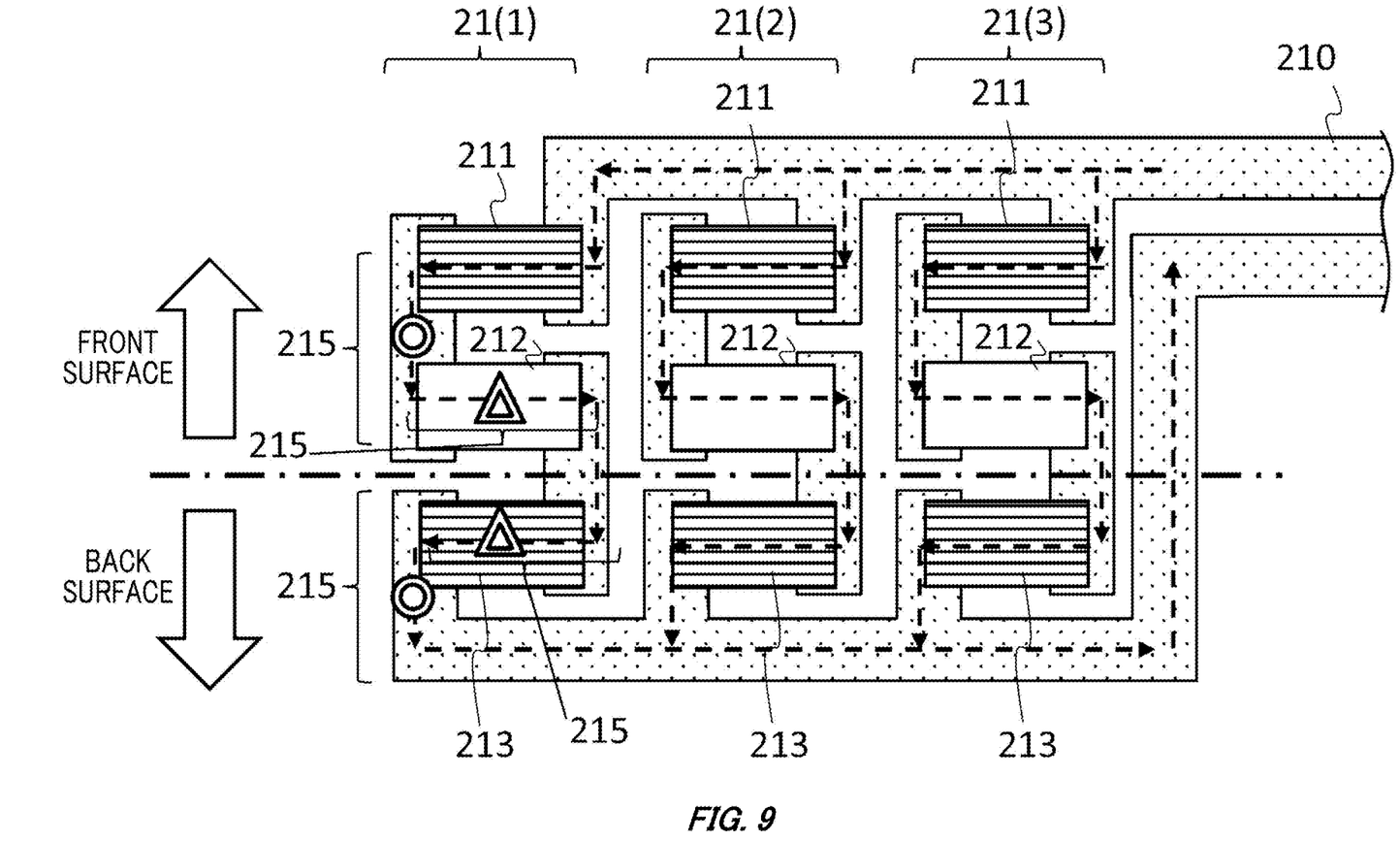
FIG. 9 shows a variation of the layout of the charge path 21.

FIG. 9 shows a variation of the layout of the charge path 21. In the figure, the upper side of a one-dot chain line indicates a front surface of the board, and the lower side indicates a back surface of the board.

As shown in this figure, two or more adjacent sections 215 of the plurality of adjacent sections 215 included in the charge path 21 may be provided with a board interposed therebetween. As a result, it can be ensured that the adjacent sections 215 differentially act on each other to mutually negate magnetic fields, and the inductance of the charge path 21 is decreased. For example, in the figure, two adjacent sections 215 marked with a circle, that is, two sections that are the section included between the positive-side terminal 201 and the first diode 212 and the section included between the negative-side capacitor 213 and the negative-side terminal 202, differentially act on each other to reduce inductance, and two adjacent sections 215 marked with a triangle, that is, two sections that are the section included between the positive-side capacitor 211 and the negative-side capacitor 213 and the section included between the first diode 212 and the negative-side terminal 202, differentially act on each other to reduce inductance.

Figure 10:
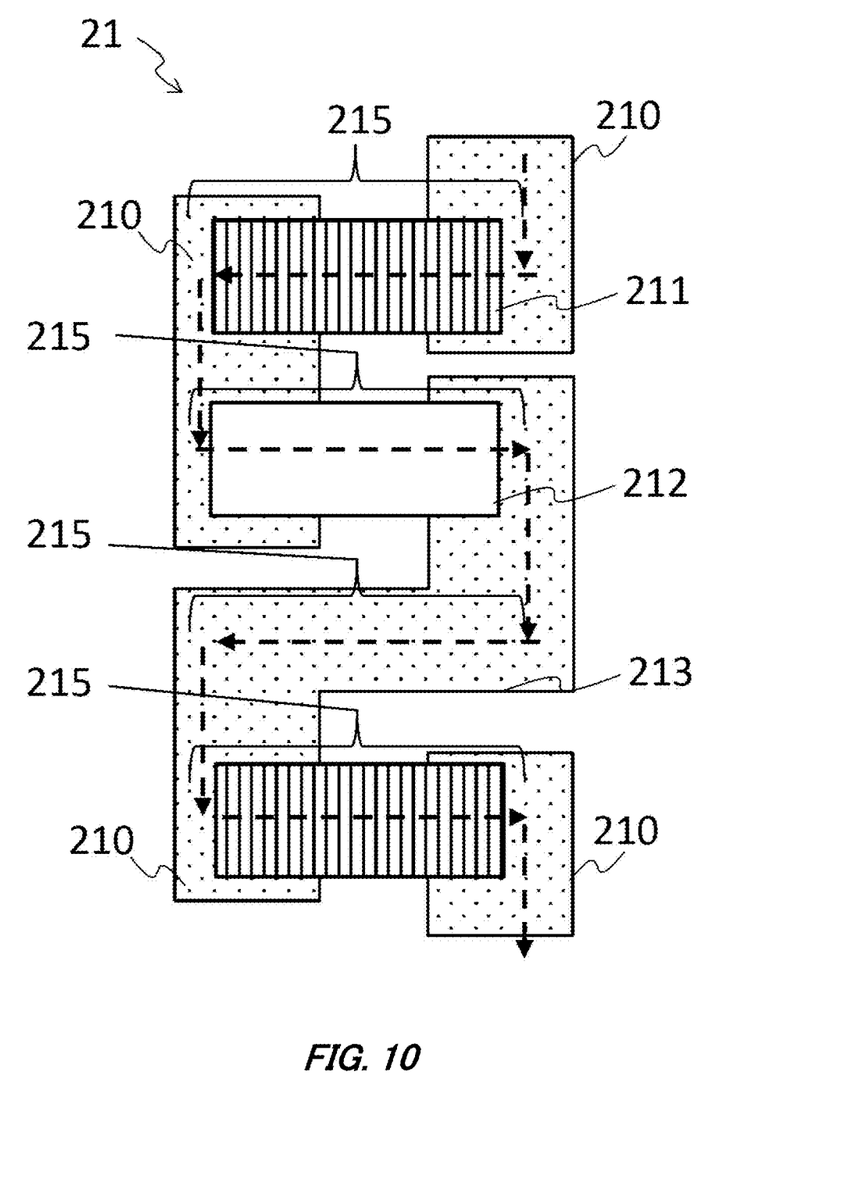
FIG. 10 shows another variation of the layout of the charge path 21.

FIG. 10 shows another variation of the layout of the charge path 21. The charge path 21 may have an even number of adjacent sections 215. This allows the inductance of the charge path 21 to be effectively reduced. For example, in the figure, the charge path 21 includes four adjacent sections 215: the section included between the positive-side terminal 201 and the first diode 212, the section included between the positive-side capacitor 211 and the negative-side capacitor 213, the section included between the first diode 212 and the negative-side capacitor 213, and the section included between the first diode 212 and the negative-side terminal 202.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

1: power conversion apparatus
2: snubber circuit
3: switching circuit
4: voltage
5: semiconductor module
7: snubber apparatus
10: power source capacitor
11: switching device
12: switching device
13: freewheeling diode
14: freewheeling diode
19: power source output terminal
21: charge path
22: discharge path
51: positive-side terminal
52: negative-side terminal
101: positive-side wiring
102: negative-side wiring
201: positive-side terminal
202: negative-side terminal
210: conductor pattern
211: positive-side capacitor
212: first diode
213: negative-side capacitor
215: adjacent sections
220: conductor pattern
221: second diode
1011: wiring inductance
1012: wiring inductance

What is claimed is:

1. A snubber apparatus comprising:
N (N is an integer greater than or equal to 1) parallel charge paths, each of which has a positive-side capacitor, a first diode, and a negative-side capacitor that are sequentially connected in series between a positive-side terminal and a negative-side terminal, and which are configured to allow current to flow from the positive-side terminal's side to the negative-side terminal's side; and
N+1 parallel discharge paths, each of which has a second diode that is connected between the negative-side terminal or the negative-side capacitor in the k-th charge path (k is an integer greater than or equal to 0 and less than N) of the N charge paths, and the positive-side capacitor in the (k+1)-th charge path of the N charge paths or the positive-side terminal, and which are configured to allow current to flow from the negative-side terminal's side to the positive-side terminal's side via at least one of the negative-side capacitor and the positive-side capacitor, wherein
at least one of the charge paths has a plurality of sections that are turned and adjacent to each other.

2. The snubber apparatus according to claim 1, wherein at least two sections of the plurality of sections are provided on one surface of a board.

3. The snubber apparatus according to claim 2, wherein the at least two sections are provided in the same layer on the one surface.

4. The snubber apparatus according to claim 3, wherein two or more sections of the plurality of sections are provided with a board interposed therebetween.

5. The snubber apparatus according to claim 3, wherein the charge path is formed to include a conductor pattern, and
a distance between centerlines of the plurality of sections is 4 times or less a width of the conductor pattern.

6. The snubber apparatus according to claim 2, wherein the at least two sections are provided in different layers on the one surface.

7. The snubber apparatus according to claim 4, wherein two or more sections of the plurality of sections are provided with a board interposed therebetween.

8. The snubber apparatus according to claim 6, wherein the charge path is formed to include a conductor pattern, and
a distance between centerlines of the plurality of sections is 4 times or less a width of the conductor pattern.

9. The snubber apparatus according to claim 2, wherein two or more sections of the plurality of sections are provided with a board interposed therebetween.

10. The snubber apparatus according to claim 2, wherein the charge path is formed to include a conductor pattern, and
a distance between centerlines of the plurality of sections is 4 times or less a width of the conductor pattern.

11. The snubber apparatus according to claim 1, wherein two or more sections of the plurality of sections are provided with a board interposed therebetween.

12. The snubber apparatus according to claim 11, wherein the charge path is formed to include a conductor pattern, and a distance between centerlines of the plurality of sections is 4 times or less a width of the conductor pattern.

13. The snubber apparatus according to claim 1, wherein the charge path is formed to include a conductor pattern, and a distance between centerlines of the plurality of sections is 4 times or less a width of the conductor pattern.

14. A power conversion apparatus comprising:
the snubber apparatus according to claim 1; and
a switching circuit connected to the positive-side terminal and the negative-side terminal.

15. The power conversion apparatus according to claim 14, wherein a part of a wiring between a positive-side terminal of the switching circuit and a positive-side terminal of the snubber apparatus, and a part of a wiring between a negative-side terminal of the switching circuit and a negative-side terminal of the snubber apparatus are adjacent to each other.

* * * * *